(12) United States Patent
Dove et al.

(10) Patent No.: US 6,625,028 B1
(45) Date of Patent: Sep. 23, 2003

(54) HEAT SINK APPARATUS THAT PROVIDES ELECTRICAL ISOLATION FOR INTEGRALLY SHIELDED CIRCUIT

(75) Inventors: Lewis R. Dove, Monument, CO (US); Marvin G. Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/176,025

(22) Filed: Jun. 20, 2002

(51) Int. Cl.[7] .............................. H05K 7/20; H05K 9/00
(52) U.S. Cl. ...................... 361/707; 165/80.2; 165/185; 174/35 R; 174/35 GC; 257/711; 257/707; 257/713; 257/659; 257/660; 361/719; 361/818; 361/816
(58) Field of Search ............................... 165/80.2, 80.3, 165/185; 174/16.3, 35 R, 35 GC, 35 MS, 252; 257/706–707, 717, 728, 711–713, 659, 660; 361/704–710, 719–721, 816, 818

(56) References Cited

U.S. PATENT DOCUMENTS

| | | | | |
|---|---|---|---|---|
| 4,509,096 A | * | 4/1985 | Baldwin et al. ............ 361/707 |
| 4,628,407 A | * | 12/1986 | August et al. ............... 361/707 |
| 5,740,013 A | * | 4/1998 | Roesner et al. ............. 361/697 |
| 5,825,625 A | * | 10/1998 | Esterberg et al. ........... 361/719 |
| 6,208,516 B1 | * | 3/2001 | Fangonilo et al. .......... 361/704 |
| 6,365,960 B1 | * | 4/2002 | Pollock et al. .............. 257/659 |

* cited by examiner

Primary Examiner—Gregory Thompson

(57) ABSTRACT

In one embodiment, a heat sink apparatus that provides electrical isolation for an integrally shielded, electronic circuit. The heat sink apparatus comprises a substrate having a first hole extending between a first and second sides of the substrate, a conductive layer attached to the second side, an electrically and thermally conductive heat sink having a protrusion, wherein the heat sink is attached to the first side of the substrate, and an electrically conductive plate having a second hole extending through the plate. The protrusion extends through the first hole and has a surface located at substantially the same level as that of the conductive layer. An electronic component is attachable to the protrusion surface. The plate is electrically coupled to the conductive layer and to the protrusion surface such that open space between the protrusion and the conductive layer is covered by electrically conducting area of the plate.

3 Claims, 4 Drawing Sheets

HEAT SINK APPARATUS THAT PROVIDES ELECTRICAL ISOLATION FOR INTEGRALLY SHIELDED CIRCUIT

FIELD OF THE INVENTION

The present invention relates generally to the field of microwave circuits, and more particularly to integrated thick film RF and microwave microcircuit modules, and even more particularly to the dissipation of heat generated by such modules.

BACKGROUND OF THE INVENTION

Microwaves are electromagnetic energy waves with very short wavelengths, typically ranging from a millimeter to 30 centimeters peak to peak. In high-speed communications systems, microwaves are used as carrier signals for sending information from point A to point B. Information carried by microwaves is transmitted, received, and processed by microwave circuits.

Packaging of radio frequency (RF) and microwave microcircuits has traditionally been very expensive and has required very high electrical isolation and excellent signal integrity through gigahertz frequencies. Additionally, integrated circuit (IC) power densities can be very high. Microwave circuits require high frequency electrical isolation between circuit components and between the circuit itself and other electronic circuits. Traditionally, this need for isolation was resulted in building the circuit on a substrate, placing the circuit inside a metal cavity, and then covering the metal cavity with a metal plate. The metal cavity itself is typically formed by machining metal plates and then connecting multiple plates together with solder or an epoxy. The plates can also be cast, which is a cheaper alternative to machined plates. However, accuracy is sacrificed with casting.

One problem attendant with the more traditional method of constructing microwave circuits is that the method of sealing the metal cover to the cavity uses conductive epoxy. While the epoxy provides a good seal, it comes with the cost of a greater electrical resistance, which increases the loss in resonant cavities and increases leakage in shielded cavities. Another problem with the traditional method is the fact that significant assembly time is required, thereby increasing manufacturing costs.

Another traditional approach to packaging RF/microwave microcircuits has been to attach gallium arsenide (GaAs) or bipolar integrated circuits and passive components to thin film circuits. These circuits are then packaged in the metal cavities discussed above. Direct current feed-through connectors and RF connectors are then used to connect the module to the outside world.

Still another method for fabricating an improved RF microwave circuit is to employ a single-layer thick film technology in place of the thin film circuits. While some costs are slightly reduced, the overall costs remain high due to the metallic enclosure and its connectors, and the dielectric materials typically employed (e.g., pastes or tapes) in this type of configuration are electrically lossy, especially at gigahertz frequencies. The dielectric constant is poorly controlled at both any specific frequency and as a function of frequency. In addition, controlling the thickness of the dielectric material often proves difficult.

A more recent method for constructing completely shielded microwave modules using only thick film processes without metal enclosures is disclosed by Lewis R. Dove, et al. in U.S. Pat. No. 6,255,730 entitled "Integrated Low Cost Thick Film RF Module".

Heat dissipation from integrated circuits and other devices in high frequency microcircuits is an especially difficult problem. In order to increase heat transfer from those microcircuit devices having high heat dissipation, the devices are often attached directly to heat sinks, also referred to as heat spreaders or heat pedestals. However, lower thermal conductivity often precludes attachment to the organic or ceramic substrate typically used in such circuits.

Thus, when high power integrated circuits or other high power devices are used in an integrated Thick Film Microwave Module, a hole is usually cut in the ceramic substrate to accommodate a metallic heat sink. This cut breaks the electrical isolation provided by a ground plane typically located on top of the substrate. This break in electrical isolation is undesirable for microwave applications as they typically require very high electrical isolation. Breaks in the ground plane result in the radiation of electromagnetic energy.

Thus, there is a need for a means of attaching heat sinks to devices in high frequency microcircuits without compromising the electrical isolation of the module.

SUMMARY OF THE INVENTION

In one embodiment, a heat sink apparatus that provides electrical isolation for an integrally shielded, electronic circuit comprises a substrate having a first hole extending between a first and second sides of the substrate, a conductive layer attached to the second side, an electrically and thermally conductive heat sink having a protrusion, wherein the heat sink is attached to the first side of the substrate, and an electrically conductive plate having a second hole extending through the plate. The protrusion extends through the first hole and has a surface located at substantially the same level as that of the conductive layer. An electronic component is attachable to the protrusion surface. The plate is electrically coupled to the conductive layer and to the protrusion surface such that open space between the protrusion and the conductive layer is covered by electrically conducting area of the plate.

In another embodiment, a heat sink apparatus that provides electrical isolation for an integrally shielded, electronic circuit comprises a substrate having a first hole extending between a first and second sides of the substrate, a conductive layer attached to the second side, and an electrically and thermally conductive heat sink having a protrusion. The heat sink is attached to the first side of the substrate. The protrusion extends through the first hole and has a surface located at substantially the same level as that of the conductive layer. An electronic component larger than the protrusion surface is electrically connectable to the conductive layer and is electrically and thermally connectable to the protrusion surface such that open space between the protrusion and the conductive layer is covered by the electronic component.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements.

DETAILED DESCRIPTION OF THE PREFERRED EMBODIMENTS

Figure 1:
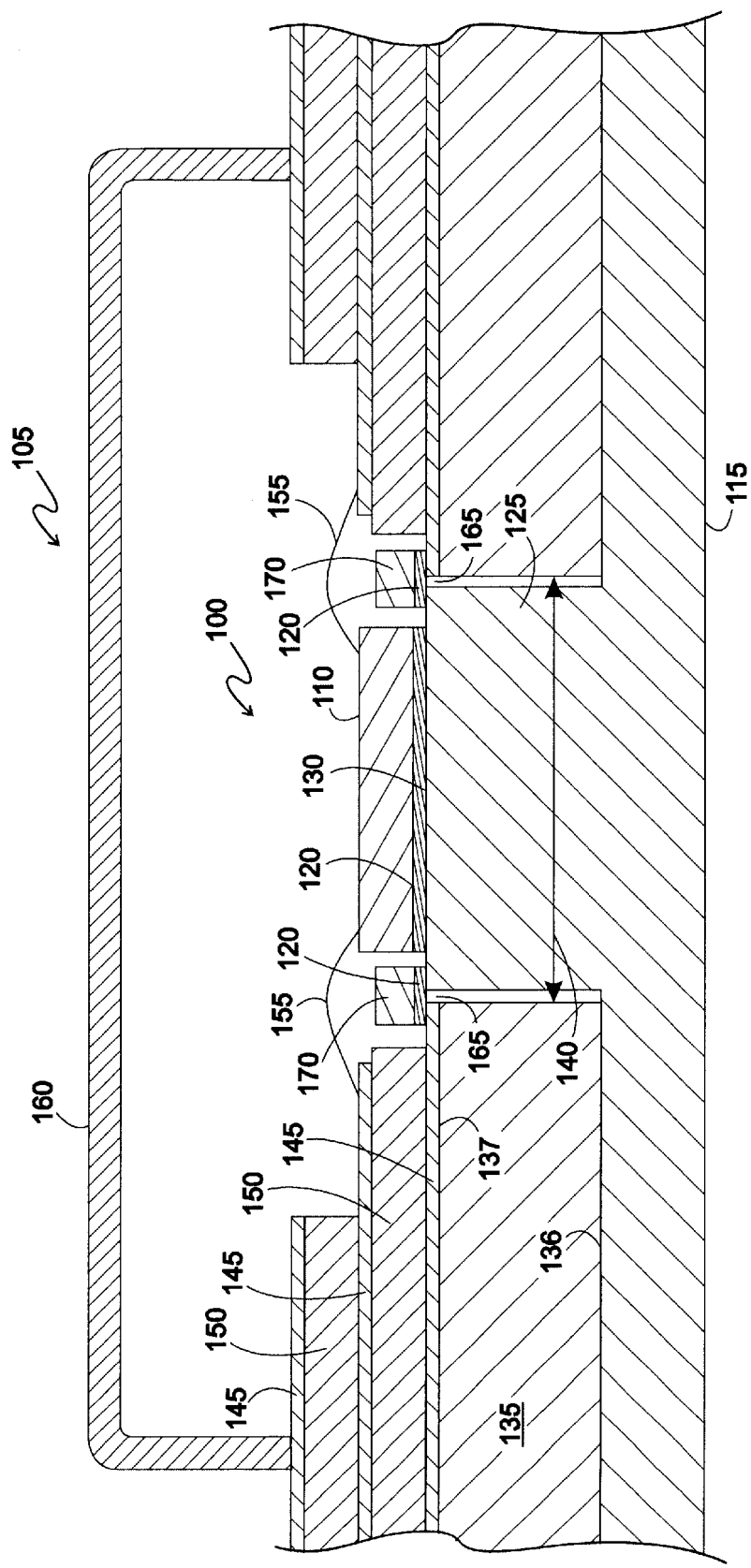
FIG. 1 is a drawing of a heat sink apparatus that provides electrical isolation for an integrally shielded, electronic circuit as described in various representative embodiments consistent with the teachings of the invention.

As shown in the drawings for purposes of illustration, the present patent document relates to a novel heat sink apparatus that provides electrical isolation for an electronic circuit. Previous heat sinks have resulted in imperfect encapsulation and thus allowed electromagnetic signals, especially those at high-frequencies, to radiate from the enclosures in which the circuits are integrally shielded.

In the following detailed description and in the several figures of the drawings, like elements are identified with like reference numerals.

FIG. 1 is a drawing of a heat sink apparatus 100 that provides electrical isolation for an integrally shielded, electronic circuit 105 as described in various representative embodiments consistent with the teachings of the invention. In FIG. 1, the electronic circuit 105 is a microcircuit 105. An electronic component 110 which could be, for example, an integrated circuit 110 is attached to a heat sink 115 via conductive adhesive 120, solder paste 120, or the like. The heat sink 115 is also often referred to as a heat spreader 115 and as a heat pedestal 115, the term heat pedestal 115 referring to a protrusion 125 or pedestal 125 extending from the body of the heat sink 115. The electronic component 110 is attached to the protrusion 125 at a protrusion surface 130. The heat sink 115 is attached to a first side 136, also referred to herein as a bottom side 136, of a substrate 135. The substrate 135 has a first hole 140 extending from the first side 136 through to a second side 137, also referred to herein as a top side 137, of the substrate 135. Conductive layers 145 separated by dielectric layers 150 are used to electrically couple the electronic component 110, via wires 155 bonded to the electronic component 110 and the conductive layers 145, to other parts of the microcircuit 105. Various structures of the microcircuit 105, including the conductive layers 145 and dielectric layers 150, are typically created using conventional thin film deposition techniques or conventional thick film screening techniques. The conductive layer 145 attached to the top side 137 of the substrate 135 is typically a ground plane and electrically coupled to the heat sink 115 through a conducting via, not shown in the drawings. A conducting lid 160 provides electrical shielding of the microcircuit 105 on the top side of the microcircuit 105. Due to imperfect fabrication techniques, a gap 165 or open space 165 exists between the protrusion 125 of the heat sink 115 and the conductive layer 145 attached to the top side 137 of the substrate 135 through which electromagnetic signals can radiate. This open space 165 is closed, thus preventing radiation of the electromagnetic signals through the open space 165, via attachment of an electrically conductive plate 170 between the protrusion 125 and the conductive layer 145 attached to the substrate 135. The conductive plate 170 is typically attached via a conventional conductive adhesive 120 or solder 120.

Figure 2:
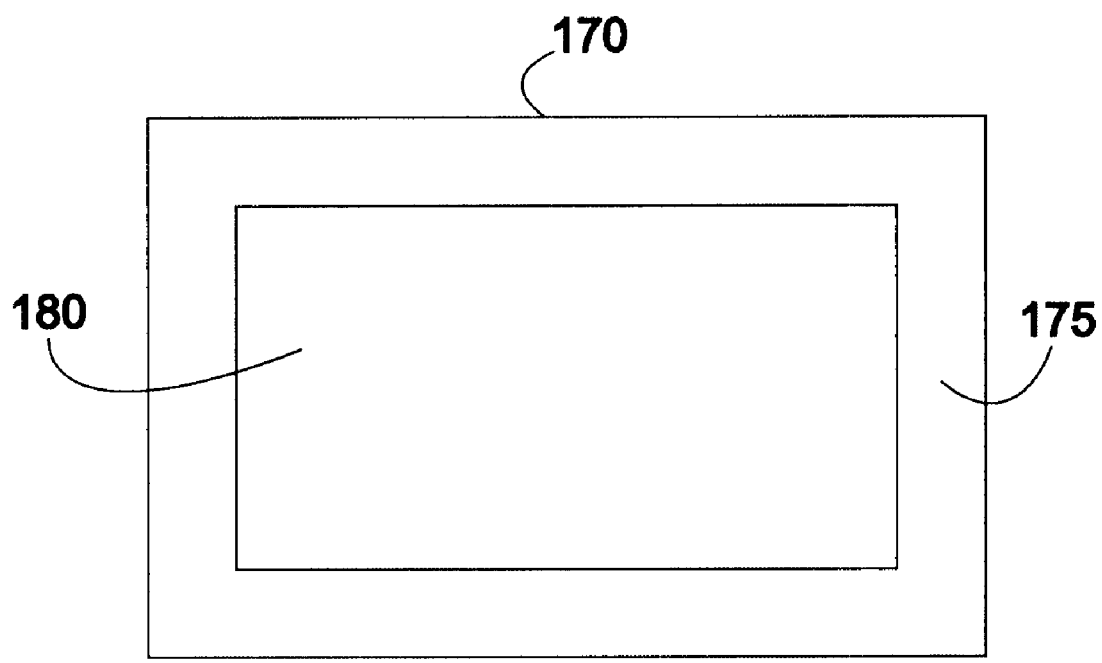
FIG. 2 is a drawing of a top view of the conducting plate as described in various representative embodiments consistent with the teachings of the invention.

FIG. 2 is a drawing of a top view of the conductive plate 170 as described in various representative embodiments consistent with the teachings of the invention. The conductive plate 170 comprises an electrically conductive area 175 and an opening 180 in the plate 170. The opening 180 is also referred to herein as a second hole 180. Referring to FIG. 1, the electronic component 110 is attached to the protrusion 125 of the heat sink 115 within the opening 180 of the plate 170. The conductive area 175 of the plate 170 is attached to the substrate 135 with the conductive area 175 of the electrically conductive plate 170 covering the open space 165 and preventing radiation of the electromagnetic signals through the open space 165.

In the embodiments of FIGS. 1 and 2, the plate 170 could be fabricated as a thin piece of conductive material, as for example Kovar, to bridge the gap between the so-called top-bottom ground plane, identified herein as the conductive layer 145 attached to the top side 137 of the substrate 135, of an integrated thick film microwave module and the heat sink 115. This plate 170 could be soldered or attached with a conductive adhesive 120. If solder 120 is used, the plate 170 could be fabricated with a solder preform 120. The integrated circuit 110 or other electronic component 110 is then attached to the protrusion 125 of the heat sink 115 using solder 120 or a conductive adhesive 120. The integrated circuit 110 is located within the opening 180 in the plate 170. The plate 170 and grounded heat sink 115 provide electrical continuity for the module's ground.

Figure 3:
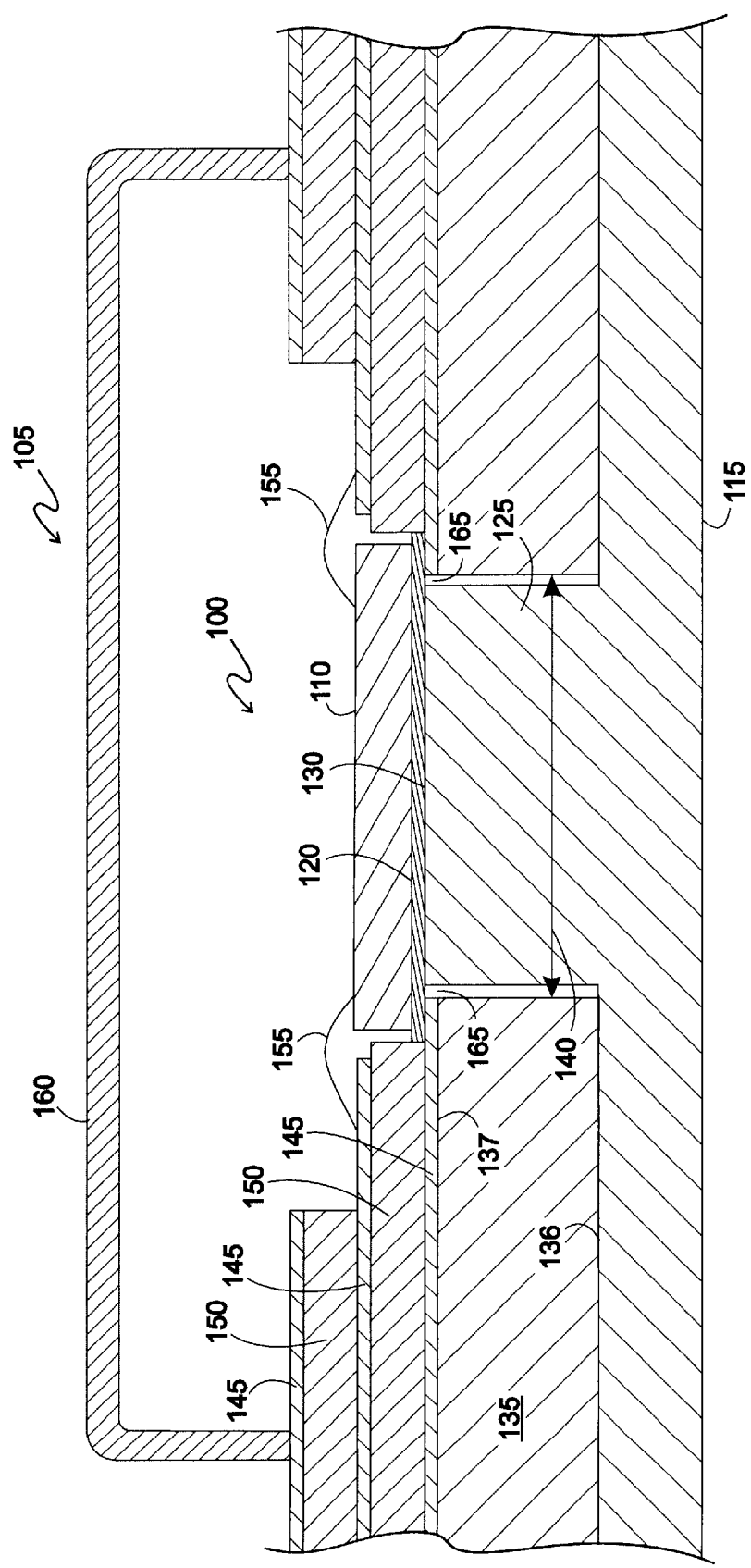
FIG. 3 is a drawing of another heat sink apparatus that provides electrical isolation for an integrally shielded, electronic circuit as described in various representative embodiments consistent with the teachings of the invention.

FIG. 3 is a drawing of another heat sink apparatus 100 that provides electrical isolation for an integrally shielded, electronic circuit 105 as described in various representative embodiments consistent with the teachings of the invention. In FIG. 3, the electronic circuit 105 is a microcircuit 105. An electronic component 110 which could be, for example, an integrated circuit 110 is attached to a protrusion 125 of a heat sink 115 typically via conductive adhesive 120, solder paste 120, or the like. The electronic component 110 is attached to the protrusion 125 at protrusion surface 130. The heat sink 115 is attached to the bottom side 136 of the substrate 135. The substrate 135 has a first hole 140 extending from the first side 136 through to the top side 137, of the substrate 135. Conductive layers 145 separated by dielectric layers 150 are used to electrically couple the electronic component 110, via wires 155 bonded to the electronic component 110 and the conductive layers 145, to other parts of the microcircuit 105. Various structures of the microcircuit 105, including the conductive layers 145 and dielectric layers 150, are typically deposited using conventional thin film techniques or screened on using conventional thick film techniques. The conductive layer 145 attached to the top side 137 of the substrate 135 is typically a ground plane and electrically coupled to the heat sink 115 through a conducting via, not shown in the drawings. The conducting lid 160 provides electrical shielding of the microcircuit 105 on the top side 137 of the microcircuit 105. Due to imperfect fabrication techniques, the gap 165 or open space 165 exists between the protrusion 125 of the heat sink 115 and the conductive layer 145 attached to the top side 137 of the substrate 135 through which electromagnetic signals can radiate. This open space 165 is closed, thus preventing radiation of the electromagnetic signals through the open space 165, by constructing the protrusion 125 of the heat sink 115 to be smaller than the electronic component 110 and then attaching the electronic component 110 such that it overlaps the open space 165 electrically connecting the protrusion 125 and the conductive layer 145 attached to the substrate 135.

Figure 4:
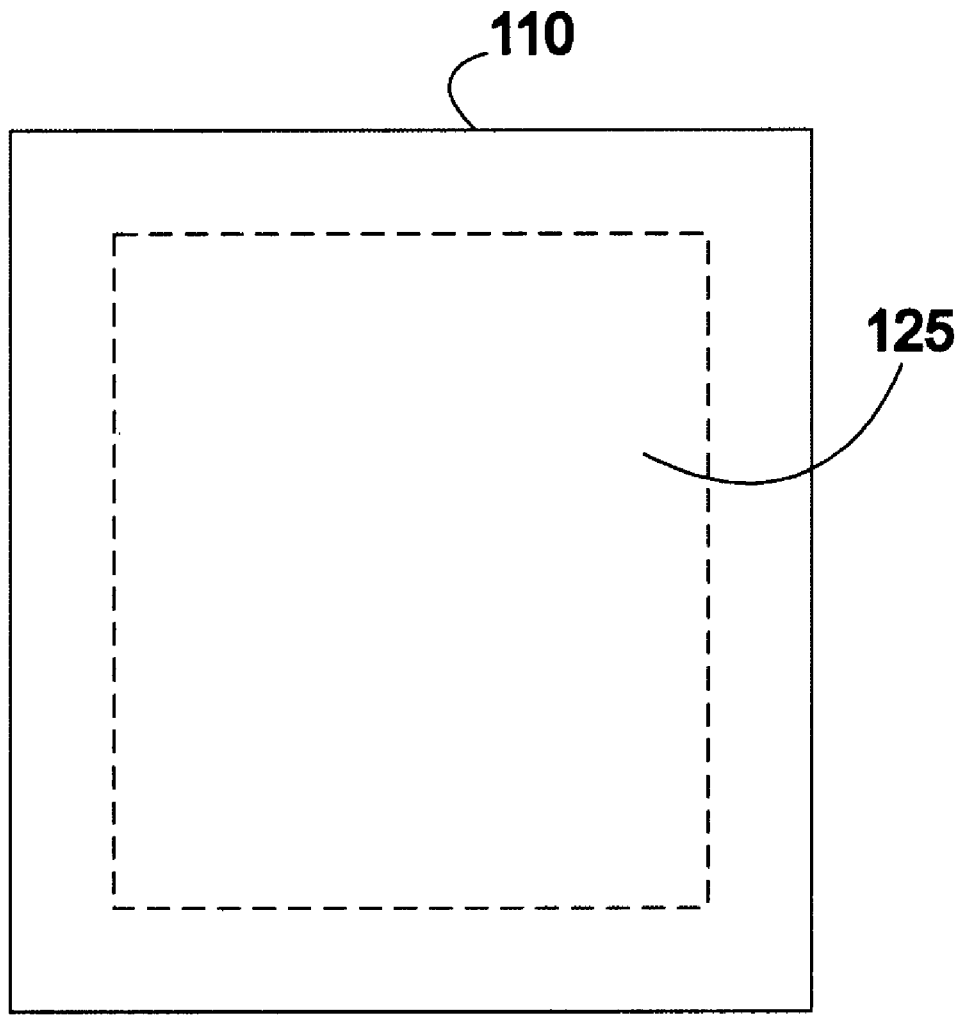
FIG. 4 is a drawing of a top view of the electronic component and protrusion as described in various representative embodiments consistent with the teachings of the invention.

FIG. 4 is a drawing of the top view of the electronic component 110 and protrusion 125 as described in various representative embodiments consistent with the teachings of the invention. Referring to FIG. 3, the electronic component 110 is attached to the protrusion 125 of the heat sink 115. The electronic component 110, which is slightly larger than the protrusion surface 130, is also attached to the conductive layer 145 attached to the substrate 135, thereby covering the open space 165 and preventing radiation of the electromagnetic signals through the open space 165.

For the embodiments of FIGS. 3 and 4, the protrusion 125 of the heat sink 115 is designed to be slightly smaller than the integrated circuit 110. The back of the integrated circuit is used to bridge the gap 165 between the microcircuit module's 105 so-called top-bottom ground plane, identified herein as the conductive layer 145 attached to the top side 137 of the substrate 135, and the protrusion 125 of the heat sink 115. The integrated circuit 110 is soldered or attached with a conductive adhesive 120 to both the protrusion 125 of the heat sink 115 and the top-bottom ground plane on the microcircuit module's 105 substrate 135. This attachment can be performed by carefully controlling the height of the top of the protrusion 125 of the heat sink 115 in relation to the top of the substrate 135 by using die attach material to take up any difference. This embodiment eliminates the plate 170 and permits shorter wire/ribbon bonds to be used to connect the integrated circuit die 110 to the microcircuit module's 105 conductive layers 145 which is an important consideration for many high frequency applications so as to minimize the parasitic inductance associated with the die bonding.

Thus, preferred embodiments of the heat sink apparatus 100 provide the ability to electrically isolate microcircuits 105 by covering open spaces 165 between the protrusions 125 of heat sinks 115 and the holes 140 in the substrates 135 through which they pass. Thereby, leakage of electromagnetic radiation around the heat sink attachment is prevented.

While the present invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. A heat sink apparatus that provides electrical isolation for an integrally shielded, electronic circuit, which comprises:

a substrate having a first hole extending between a first and second sides of the substrate;

a conductive layer attached to the second side;

an electrically and thermally conductive heat sink having a protrusion, wherein the heat sink is attached to the first side of the substrate, wherein the protrusion extends through the first hole, wherein the protrusion has a surface located at substantially the same level as that of the conductive layer, and wherein an electronic component is attachable to the protrusion surface; and an electrically conductive plate having a second hole extending through the plate, wherein the plate is electrically coupled to the conductive layer and to the protrusion surface such that open space between the protrusion and the conductive layer is covered by electrically conducting area of the plate.

2. The heat sink apparatus as recited in claim 1, wherein the apparatus is part of an integrated thick film microcircuit.

3. The heat sink apparatus as recited in claim 1, wherein the conductive layer, the plate, and the heat sink are at ground potential.

* * * * *